United States Patent [19]

Ormond

[11] Patent Number: 4,608,553
[45] Date of Patent: Aug. 26, 1986

[54] ANALOG TO DIGITAL CONVERTER WITHOUT ZERO DRIFT

[76] Inventor: A. Neuman Ormond, 12020 E. Rivera Rd., Santa Fe Springs, Calif. 90670

[21] Appl. No.: 471,180

[22] Filed: Mar. 1, 1983

Related U.S. Application Data

[63] Continuation-in-part of Ser. No. 262,555, May 11, 1981.

[51] Int. Cl.$^4$ .............................................. H03K 13/02
[52] U.S. Cl. ........................ 340/347 NT; 324/99 D; 340/347 AD; 340/347 CC; 340/347 M
[58] Field of Search .... 340/347 NT, 347 M, 347 AD, 340/347 LL; 324/99 D, 76 A

[56] References Cited

U.S. PATENT DOCUMENTS

| | | | |
|---|---|---|---|
| 3,534,257 | 10/1970 | Charap et al. | 340/347 M X |
| 3,750,142 | 7/1973 | Barnes et al. | 340/347 M X |
| 3,940,759 | 2/1976 | Zitelli et al. | 340/347 CC X |
| 4,390,864 | 6/1983 | Ormond | 340/347 NT |

Primary Examiner—T. J. Sloyan
Attorney, Agent, or Firm—Ralph B. Pastoriza

[57] ABSTRACT

The conversion is effected by adding equal and opposite reference voltages to the analog signal to provide two first output voltage levels. The voltage difference between these levels is converted into a first given number of pulses. The polarity of the analog signal is then reversed during the second half of the cycle so as to be subtracted from the reference voltages for providing two second output voltage levels. The voltage difference between these levels is converted into a second given number of pulses. A function of the first and second number of pulses provides a numerical count directly proportional to the analog signal with all zero drift eliminated. A second conversion can be made to provide a digital read-out which is free from both zero drift and span drift.

1 Claim, 6 Drawing Figures

ANALOG TO DIGITAL CONVERTER WITHOUT ZERO DRIFT

This application is a continuation in part of my co-pending patent application Ser. No. 06/262,555 filed May 11, 1981 and entitled: ANALOG TO DIGITAL CONVERTER WITHOUT ZERO DRIFT.

FIELD OF THE INVENTION

This invention relates to analog to digital converters and more particularly to an improved analog to digital converter in which zero drift and preferably also span drift are eliminated.

BACKGROUND OF THE INVENTION

Conventional dual slope integrator analog to digital converters are generally preferred where low voltage input signals are to be measured. The dual slope technique provides excellent noise rejection and an accuracy that, in general, is independent of the clock pulse rate and integrating resistors and capacitors. However, such known circuits have a first order of sensitivity to zero drift and a second order of sensitivity to span error with temperature. Further, it is generally difficult to obtain bi-polar operation using conventional known techniques.

In its practical form, the accuracy of an analog to digital converter depends upon the following characteristics of the basic circuit:

(1) offset voltage of the pre-amplifier or buffer, integrator and cross-over detector;

(2) offset voltage drift of the pre-amplifier or buffer, integrator and cross-over detector;

(3) dynamics of the switches, capacitors, pre-amplifier, integrator and cross-over detector;

(4) discontinuities at or near zero signal associated with achieving bi-polar signal conversion;

(5) internal circuit noise;

(6) linearity of the amplifier, integrator and cross-over detectors.

Any analog to digital conversion circuit which would provide for improvement in the foregoing characteristics would be highly desirable.

In my U.S. Pat. No. 4,107,618 there is described an operational differential amplifier system wherein the signal gain of an input analog signal can be made independent of a reference voltage. The technique described in this patent can be used to advantage in the provision of a greatly improved analog to digital converter wherein zero drift is essentially eliminated.

BRIEF DESCRIPTION OF THE PRESENT INVENTION

With the foregoing in mind, the present invention provides such an improved analog to digital converter without zero drift and in its preferred embodiment span drift due to temperature is also eliminated.

Briefly, in accord with the basic method of the present invention, an analog signal is converted to a numerical count directly proportional to the signal without zero drift by utilizing a reference voltage in a circuit portion similar to that described in my aforementioned U.S. patent. A first conversion is effected in accord with the following steps:

First, a differential operational amplifier means is used for adding the analog signal to the reference voltage to provide two first output voltage levels. A first ramp voltage of a given slope is generated along with a series of clock pulses. A counter is provided for the clock pulses. The counter is caused to start and stop by first signals generated at points in time when the first ramp voltage crosses over the two first output voltage levels respectively to define a first given number N1 of pulses. The analog signal is then reversed in polarity so that it is subtracted from the reference voltage through the differential operational amplifier means to provide two second output voltage levels.

A second ramp voltage of the same slope as the first ramp voltage is generated and appropriate start and stop signals to the counter are generated at points in time when this second ramp voltage crosses over the two second output voltage levels respectively to thereby provide a second given number N2 of pulses. The N1 and N2 pulses are subtracted and added, the ratio of these two operations providing the numerical count.

The foregoing fixed slope technique utilizing a reference voltage eliminates all zero drift. Further, by effecting a second conversion to provide a new numerical count, this new numerical count can be combined with the original numerical count derived from the first conversion to yield a numerical count proportional to the analog signal which is free of both zero and span drift.

Substantial improvement is thus provided in the first four characteristics described heretofore and some improvement is also shown for the last two characteristics. Filtering circuits can be added where time response is not a major requirement to provide further elimination of internal circuit noise.

DETAILED DESCRIPTION OF THE INVENTION

Figure 1:
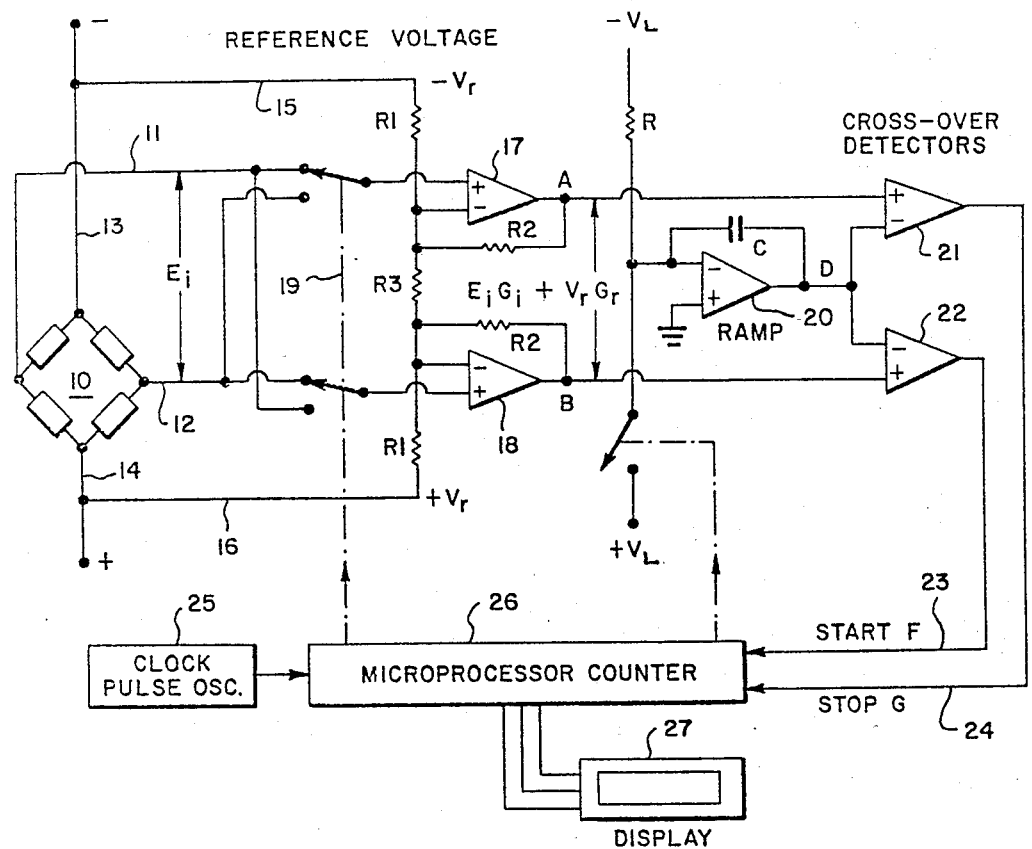
FIG. 1 is a basic circuit diagram partly in block form of the analog to digital converter without zero drift.

Referring first to FIG. 1, there is shown a strain gauge bridge 10 from which an analog input signal Ei is derived from diagonally opposite points of the bridge on leads 11 and 12. The other diagonals of the bridge connect to power leads 13 and 14.

As an example of a typical analog input signal that is to be measured, the elements of the bridge could constitute strain gauges on a load cell so that changes in the loading of the cell will be reflected in changes in the analog input signal Ei.

In accord with a first feature of the present invention there is provided a given or fixed reference voltage Vr which can be derived from the power supply for the bridge 10 as on leads 15 and 16. This reference voltage along with the input analog signal Ei passes to the input of a differential operational amplifier means schematically depicted by the operational amplifiers 17 and 18. A first reversing switch 19 is connected between the input signal leads 11 and 12 and the positive inputs to the amplifiers 17 and 18 as shown. The reference voltage is applied to the negative inputs of the amplifiers.

When the first reversing switch 19 is in a first position as illustrated, the analog signal is added to the reference voltage to provide two first output voltage levels at the points A and B from the amplifiers 17 and 18 respectively.

Still referring to FIG. 1, there is shown a ramp voltage generating means 20 connecting to first inputs of two cross-over detectors 21 and 22. These cross-over detectors will receive in their second inputs the two first output voltage levels at points A and B respectively to provide first start and stop signals on output leads 23 and 24 at points in time when the first ramp voltage crosses over the two first output voltage levels.

Referring to the lower portion of FIG. 1 there is shown to the left an oscillator 25 for generating a series of clock pulses and a microprocessor counter 26 for the clock pulses connected to receive the first start and stop signals on the leads 23 and 24.

Essentially, the counter will count the number of pulses generated by the clock pulse generator 25 between the start and stop signals provided on the leads 23 and 24 to provide a first numerical count of N1 pulses.

Referring back to the upper portion of FIG. 1 when the reversing switch 19 is thrown to a second position, the analog signal Ei will be subtracted from the reference voltage Vr to provide two second output voltage levels from the operational amplifiers 17 and 18 and thereby result in second start and stop signals from the cross-over detectors 22 and 21 when a second ramp voltage from the ramp voltage generator 20 of the same slope as the first ramp voltage crosses over the two second output voltage levels, the second start and stop signals starting and stopping the counter in the microprocessor block 26 to provide a second numerical count of N2 pulses.

Connected to the microprocessor counter 26 as shown in FIG. 1 is a display 27. This display is connected to show a numerical digital count N constituting the difference between the numerical counts N1 and N2 divided by the sum of the numerical counts N1 and N2, as carried out by the microprocessor counter 26.

As will be shown subsequently, this digital count N is directly proportional to the input analog voltage Ei and the relationship is wholly independent of any zero drift.

Figure 2:
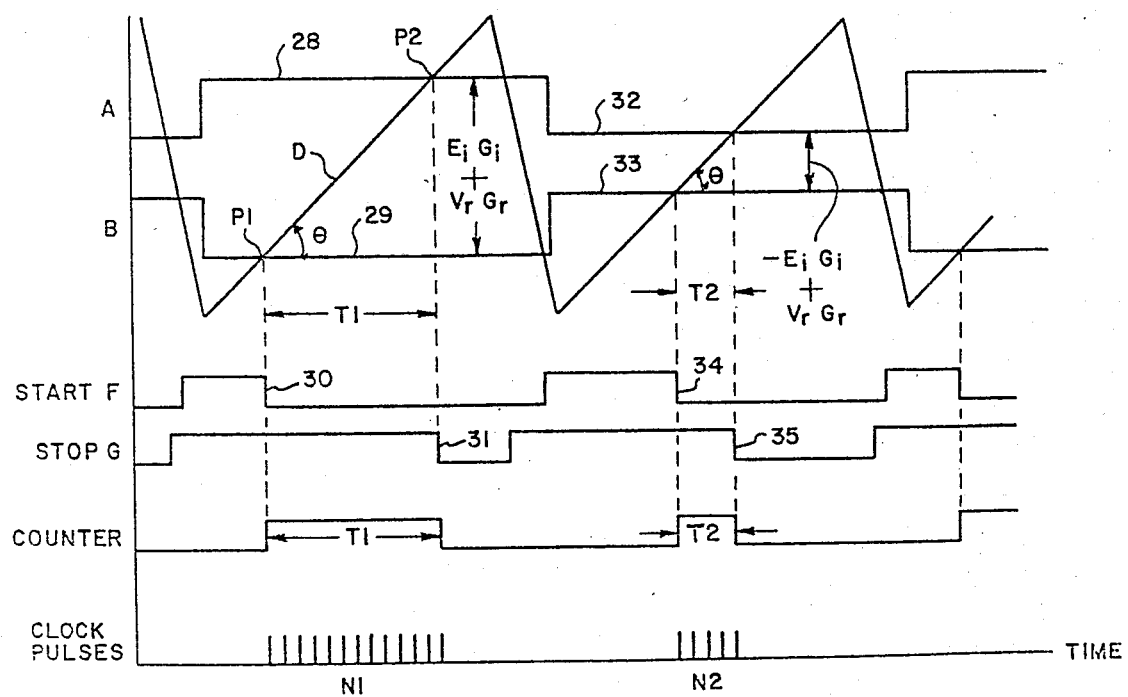
FIG. 2 is a series of timing diagrams of wave forms occurring at correspondingly lettered points in FIG. 1.

The foregoing operation can better be understood by now referring to FIG. 2 wherein the first two output voltage levels from the operational amplifiers 17 and 18 at the points A and B are illustrated at 28 and 29 in the upper wave form. The first ramp voltage is designated D and the cross-over points are indicated at P1 and P2. The analog input signal Ei and reference voltage after passing through the differential operational amplifier means are added as stated and each is augmented by a gain factor. Thus, the signal value at the output of the operational amplifiers is designated in FIG. 1 as Ei-Gi+VrGr, where Gi, Gr are the respective gain factors for the input signal and reference voltage.

In FIG. 2, this output valve from the amplifiers corresponds to the voltage level difference between the levels 28 and 29.

Referring now to the wave forms below the described top wave form in FIG. 2, there are illustrated at 30 and 31 the start and stop signals on the leads 23 and 24 of FIG. 1 occurring at the points F and G. These start and stop signals constitute the trailing edge of a wave form generated at the cross-over points from the cross-over detectors and will serve to initiate operation of the counter and terminate operation of the counter at precise points in time at which the start and stop signals occur. The period for which the counter operates is designated T1. This period of time T1 for the counter is illustrated in the next-to-last wave form of FIG. 2.

Finally, by making the oscillator 25 generating the clock pulses of fixed constant frequency, there will be a direct proportion between the number of pulses counted and the time period T1. Thus, the number of pulses counted during the time period T1 is designated N1 in FIG. 2.

When the reversing switch 19 is thrown to its other position, the analog voltage is subtracted from the reference voltage as described heretofore resulting in the second two output voltage levels shown in FIG. 2 at 32 and 33. The second start and stop signals are indicated at 34 and 35 and the second generated time period at T2. The pulses counted during this time period are designated N2.

By subtracting the N2 pulses from the N1 pulses, and dividing this result by the sum of the N1 and N2 pulses, there results the numerical count N directly proportional to the input analog voltage Ei. This count N is not only independent of zero drift but also independent of any variations in parameters determining the slope such as the voltage $V_L$, resistance R and capacitor C for the ramp generator 20 of FIG. 1.

The foregoing can readily be established by the consideration of the following equations and with specific reference to FIG. 2. Thus, the slope of the ramp D between the voltage levels 28 and 29 over the time period T1 is given by:

$$\tan\theta = -\left(\frac{-V_L}{RC}\right) = \frac{EiGi + VrGr}{T1} \quad (1)$$

Similarly, the same slope between voltage levels 32 and 33 over the time T2 after the reversing switch 19 is thrown is given by:

$$\tan\theta = -\left(\frac{-V_L}{RC}\right) = \frac{-EiGi + VrGr}{T2} \quad (2)$$

Equations (1) and (2) can be arranged to read as follows:

$$T1 = \frac{EiGi + VrGr}{\tan\theta} \quad (3)$$

$$T2 = \frac{-EiGi + VrGr}{\tan\theta} \quad (4)$$

Subtracting equation (4) from equation (3)

$$T1 - T2 = \frac{2EiGi}{\tan\theta} \quad (5)$$

Adding equation (4) to equation (3) gives:

$$T1 + T2 = \frac{2VrGr}{\tan\theta} \quad (6)$$

If f is the frequency of the clock generator then:

$$N1 = T1f \tag{7}$$

and $$N2 = T2f \tag{8}$$

Substituting in equations (5) and (6) gives:

$$N1 - N2 = \frac{2EiGi}{f\tan\theta} \tag{9}$$

$$N1 + N2 = \frac{2VrGr}{f\tan\theta} \tag{10}$$

It will be noted that N1+N2 as defined in equation (10) is independent of the analog voltage Ei and will only vary with changes in the clock frequency f and/or changes in the slope $\tan\ominus$. Such errors as might result from variations in these parameters, however, are eliminated by dividing equation (9) by equation (10) to yield $$\frac{N1 - N2}{N1 + N2} = \frac{EiGi}{VrGr} \tag{11}$$

From equation (11) it will be evident that the frequency term and the slope $\tan\ominus$ which includes the terms $-V_L$, R and C all cancel. Letting N=the ratio (N1−N2)/(N1+N2) and letting K=Gi/VrGr, then $$N = KEi \tag{12}$$

Equation (12) above indicates that the numerical count N is directly proportional to the input analog voltage Ei and it is the quantity N which will be shown in the display 27 of FIG. 1.

It is to be appreciated that because of the bi-polar treatment of the analog input voltage Ei by the reversing switch 19, and the taking of the ratio of N1−N2 divided by N1+N2, zero drift is completely eliminated.

Further, by taking the reference voltage, that is sensing the same by coupling to the strain gauge transducer bridge 10 in FIG. 1, there results a volt-per-volt measurement.

Figure 3:
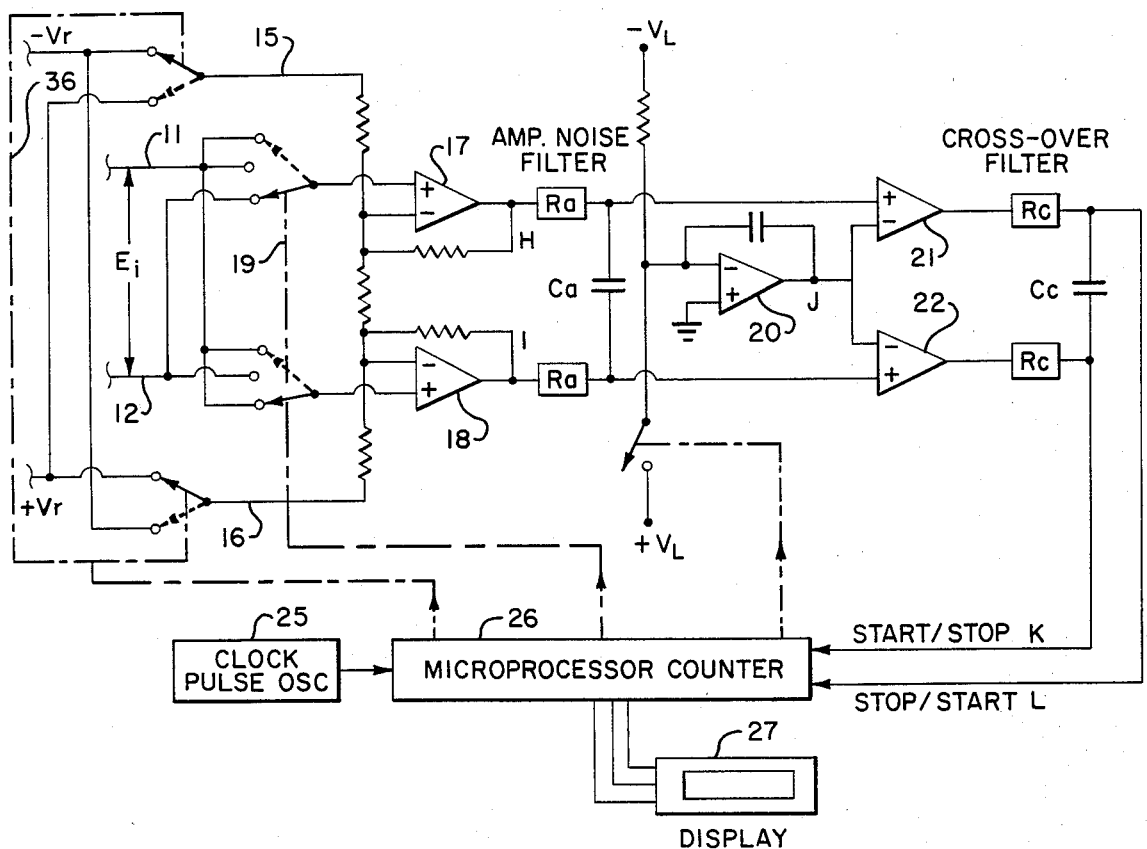
FIG. 3 is a modified analog to digital conversion circuit similar to FIG. 1 but incorporating further features.

Referring now to FIG. 3, the circuit shown is essentially the same as that of FIG. 1 and corresponding components have been indicated by like numerals. However, in FIG. 3 the first two output voltage levels from the operational amplifiers 17 and 18 are designated by the letters H and I. The ramp voltage is designated by the letter J and the start and stop signals from the cross-over detectors 22 and 21 are designated K and L. In addition, filter means have been provided for the two first output voltage levels connected to the outputs of the operational amplifiers 17 and 18 in the form of equal resistances Ra in series with the outputs and a shunting capacitor Ca.

Additional filter means have been added for the start and stop signals connected to the outputs of the cross-over detectors 21 and 22 in the form of series resistances Rc and shunting capacitor Cc.

Internal noise can be suppressed by the use of the filtering following the operational amplifier means but there is a sacrifice in time response. The additional filtering at the outputs of the cross-over detectors will function without causing any undesirable effects so long as the phase shift of both are maintained equal. It should be noted that the operational differential amplifier means provides for high common mode noise rejection.

The circuit of FIG. 3 is also designed to enable the elimination of span drift. Span drift results from changes in the off-set voltage characteristics in the differential amplifiers 17, 18 and the cross-over detectors 21 and 22 over periods of time. If there are no changes then the off-set voltages are constant and will become part of the constant K in equation (12). On the other hand, if drift occurs and is large, the span error will increase.

If (Vo+ΔVo)G and (Vo+ΔVo)C represent the off-set characteristics of the amplifiers 17, 18 and the cross-over detectors 21, 22 respectively, these quantities will be added to the output terms VrGr in equations (3) and (4). It thus will appear in equation (11) as follows:

$$\frac{N1 - N2}{N1 + N2} = \frac{EiGi}{VrGr + (Vo + \Delta Vo)G + (Vo + \Delta Vo)C} \tag{13}$$

Letting M=(Vo+ΔVo)G+(Vo+ΔVo)C and substituting in (13):

$$\frac{N1 - N2}{N1 + N2} = \frac{EiGi}{VrGr + M} \tag{14}$$

To eliminate the span coefficient and error terms M, the circuit of FIG. 3 is provided with a second reversing switch shown at 36 for the reference voltage Vr connected in the leads 15 and 16. In addition, the input analog signal switch 19 is provided with shunting terminals so that when the switch arms are thrown to the dotted line position shown, the input signal Ei is removed and a zero signal passed to the amplifiers.

Figure 4:
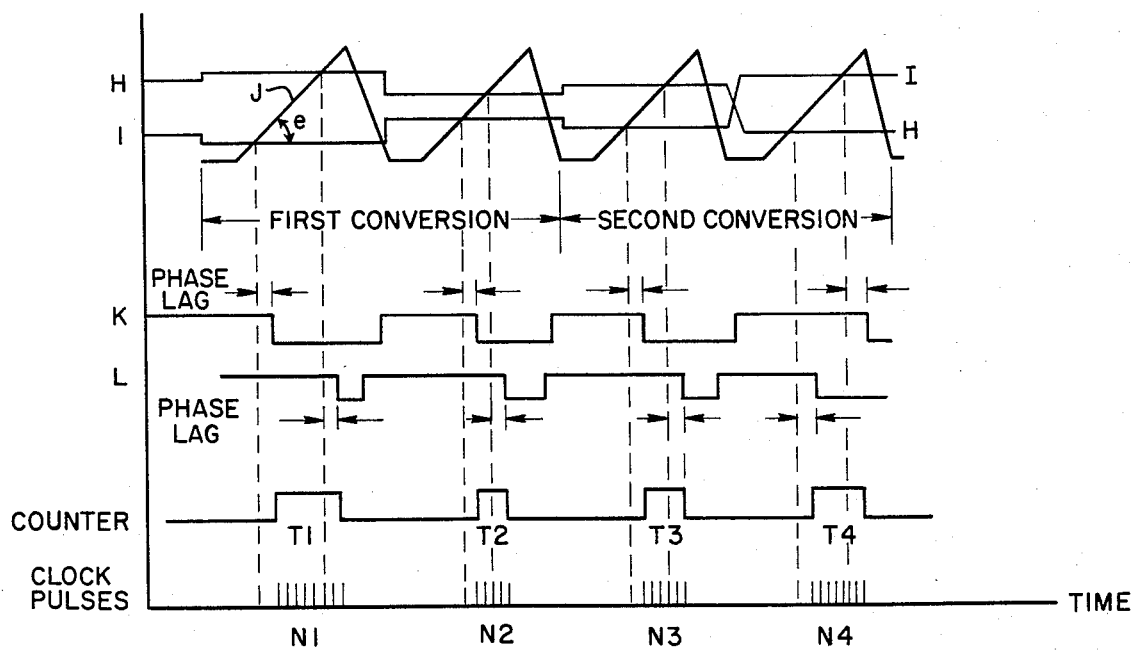
FIG. 4 shows various wave froms occurring at correspondingly lettered points in the circuit of FIG. 3.

The foregoing can better be understood by referring to a depiction of both the first and second conversions in FIG. 4.

As in the case of FIG. 2, the two top plots in FIG. 4 designate the output voltage level from the operational amplifiers 17 and 18, these levels being indicated by the letters H and I respectively to correspond to the similarly lettered output points in FIG. 3. However, there is shown both a first conversion and a second conversion.

The operation of the circuit during the first conversion is the same as that described in FIG. 1 except that there is introduced a small phase lag between the actual cross-over points of the ramp voltage J and the generation of the start and stop signals depicted by the trailing edge of the wave forms K and L respectively. This phase lag is a consequence of the filters following the differential amplifier means in FIG. 3. It will also be noted in FIG. 4 that the ramp voltage J has a small dwell time following its down side movement each period. This dwell is to allow for the phase lag of the described operational amplifier noise filter.

Referring to the lower wave forms of FIG. 4, there will be provided first and second periods T1 and T2. Similarly, there will be generated N1 and N2 pulses during these periods. These counts are processed to provide the ratio (N1−N2)/(N1+N2) as defined in equation (13). It will be understood that the values T1 and T2 and N1 and N2 are slightly different from those described with respect to FIGS. 1 and 2 in this case inasmuch as we are now considering a change in the span coefficient and error terms defined by the quantity M.

The resulting periods during the second conversion with the input zero by the shunting switch 19 and an inversion of the reference voltage Vr during the last half of the second conversion are indicated T3 and T4. The corresponding number of pulses during these periods are designated N3 and N4, and result from third and fourth start and stop signals generated by third and fourth ramp voltages crossing over two third output voltage levels and two fourth output voltage levels, respectively.

Analyzing the second conversion, it will be seen that:

$$\tan\theta = \frac{VrGr + M}{T3} \text{ (since } Ei = o\text{)} \quad (15)$$

$$\tan\theta = \frac{-VrGr + M}{T4} \text{ (since } Ei = o \text{ and } Vr \text{ is inverted)} \quad (16)$$

Rewriting:

$$T3 = \frac{VrGr + M}{\tan\theta} \quad (17)$$

$$T4 = \frac{-VrGr + M}{\tan\theta} \quad (18)$$

Subtracting (18) from (17):

$$T3 - T4 = \frac{2VrGr}{\tan\theta} \quad (19)$$

Adding (17) and (18):

$$T3 + T4 = \frac{2M}{\tan\theta} \quad (20)$$

Dividing (20) by (19)

$$\frac{T3 + T4}{T3 - T4} = \frac{M}{VrGr} ; \quad (21)$$

Since $N3 = T3f$ and $N4 = T4f$ $$\frac{N3 + N4}{N3 - N4} = \frac{M}{VrGr} ; \text{ Multiplying Eq. (14) by } 1 + \frac{N3 + N4}{N3 - N4} \quad (22)$$

$$\left[\frac{N1 - N2}{N1 + N2}\right]\left[1 + \frac{N3 + N4}{N3 - N4}\right] ; \text{ Substituting in Eq. (14) and (22)} \quad (23)$$

$$\left[\frac{EiGi}{VrGr + M}\right]\left[1 + \frac{M}{VrGr}\right] \text{ Rearranging:} \quad (24)$$

$$\left[\frac{EiGi}{VrGr + M}\right]\left[\frac{VrGr + M}{VrGr}\right] = \frac{EiGi}{VrGr} ; \quad (25)$$

Let $N' = \left[\frac{N1 - N2}{N1 + N2}\right]\left[1 + \frac{N3 + N4}{N3 - N4}\right]$ (Since $N3$ and $N4$ are independent of $Ei$) From (23) and (25)

$$N' = \frac{EiGi}{VrGr} = K'Ei, \text{ where } K' = \frac{Gi}{VrGr} \quad (26)$$

and where N' now represents a count free of both zero and span drift.

In FIG. 3, this last digital count N' is displayed in display 27.

Figure 5:
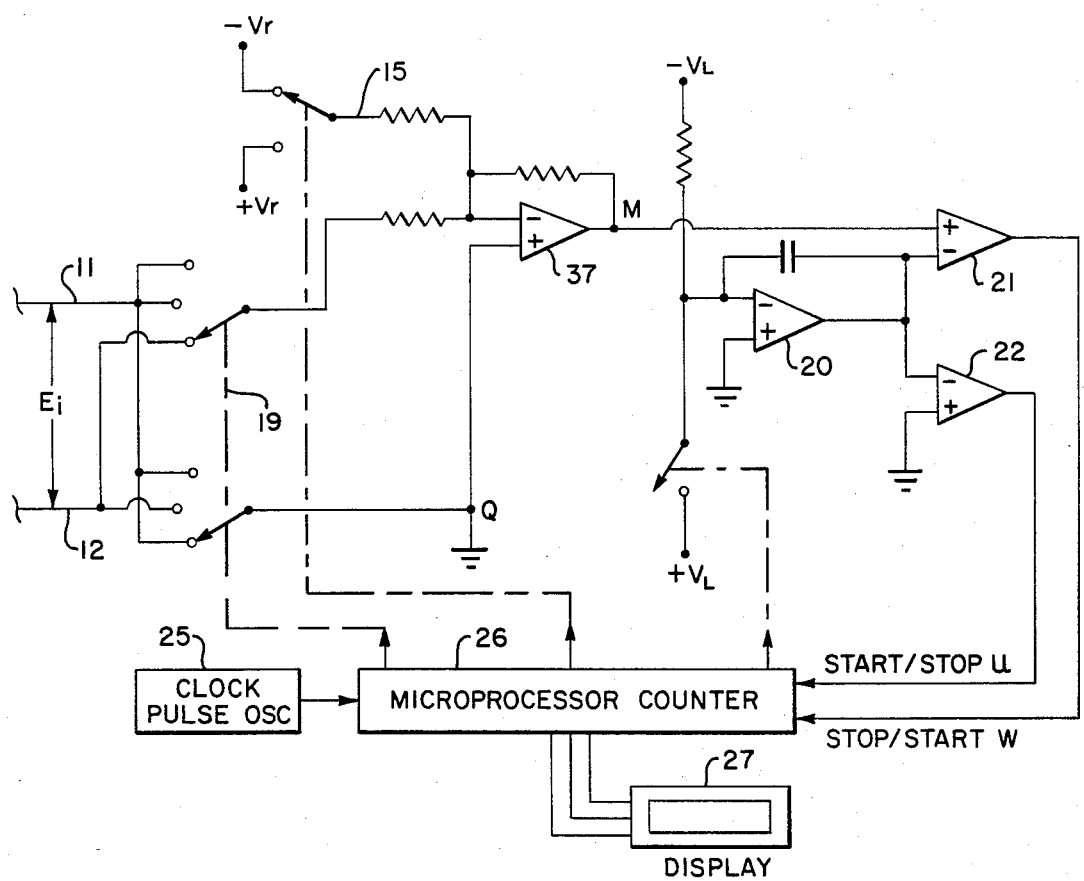
FIG. 5 is a simplified circuit over that of FIG. 3.

Referring now to FIG. 5, there is shown a simplified version of the circuit of FIG. 3, wherein the amplifier noise filters and cross-over filters have been omitted. Further, in the circuit of FIG. 5, rather than having a differential operational amplifier means made up of two operational amplifiers operating in push-pull to provide high common mode noise rejection as in FIG. 3, the differential operational amplifier means constitutes one operational amplifier shown at 37 with single ended input and ground terminals for receiving the analog signals from switch 19.

The remaining components in FIG. 5 are the same as the similarly numbered components of FIG. 3.

Because of the simplified single ended input, the first two output voltage levels corresponding to H and I in FIG. 3 now comprise voltage levels designated by the letters M and Q in FIG. 5. The Q voltage level is a ground voltage level and thus corresponds to one of the two output voltage levels while the other of the two output voltage levels M corresponds to the analog signal added to the reference voltage Vr.

For the second two output voltage levels after the reversing switch 19 has been thrown, one of these second output voltage levels again is the ground voltage level Q, the other voltage level M constituting the analog voltage subtracted from the reference voltage.

The operation of the remaining portion of the circuit in FIG. 5 is the same as that described for FIGS. 1 and 3 for the first conversion and also the same as that described for FIG. 3 for the second conversion.

Figure 6:
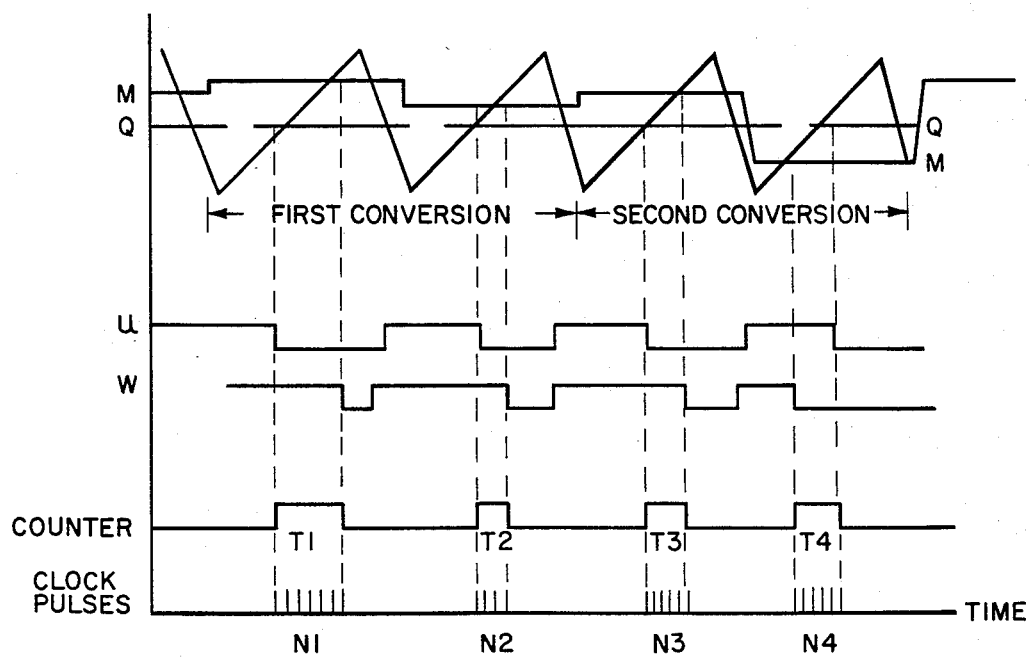
FIG. 6 illustrates various wave forms occurring at correspondingly lettered points in the circuit of FIG. 5.

With reference to the wave form shown in FIG. 6, the Q voltage level is indicated as a constant level corresponding to ground while the M voltage level assumes the two values when the analog signal is added and subtracted respectively from the reference voltage. The sweep voltage cuts across the difference between the first voltage levels and second voltage levels to provide for the N1 and N2 pulses in the same manner as described in the embodiments of FIGS. 1 and 3. The actual time periods will, of course, be somewhat different because the signal M is referenced to ground rather than to a mirror image of itself as in the case shown in the wave forms of FIGS. 2 and 4. Nevertheless, the same equations as used to describe the operations of FIGS. 1 through 4 apply.

While high common mode noise rejection cannot be achieved with the single ended operational amplifier described in FIG. 5, there does result an overall simplification of the circuit.

From all of the foregoing, the following advantages result:

First, all conversions are free from zero drift.

Second, if the second conversion taken with the input signal zero and the reference voltage inverted, is combined with the first conversion, all as described, all span drift is cancelled.

Third, the dynamics of the switches, capacitors, amplifier, integrator and cross-over detectors take place outside the conversion cycle. The capacitor C of the integrator in both FIGS. 1 and 3 (ramp generator) is not in the signal circuit. Also, it is not reversed, which eliminates the effects of holding a charge during reversal.

Fourth, filtering of internal circuit noise can be accomplished to a certain extent. Further, filtering of the output of the cross-over detectors can be accomplished without introducing any errors into the conversion.

Finally, some improvement in linearity is obtained since the analog signal is both added and subtracted from a mid point formed by the reference voltage.

It will thus be evident that the present invention has provided a greatly improved analog to digital converter wherein various problems associated with prior art dual slope type A to D converters have been eliminated and other problems substantially reduced.

I claim:

1. A system for converting an analog signal to a numerical digital count directly proportional to said analog signal without zero drift, including, in combination:

(a) a differential operational amplifier means;

(b) a source providing a reference voltage connected to said differential operational amplifier means;

(c) a first reversing switch connected to pass said analog signal to the differential operational amplifier means such that the analog signal is added to the reference voltage when said switch is in a first position to provide two first output voltage levels;

(d) a ramp voltage generating means;

(e) two cross-over detectors connected to receive said two first output voltage levels respectively and a first ramp voltage from said ramp voltage generating means to provide first start and stop signals at points in time when said first ramp voltage crosses over said two first output voltage levels;

(f) an oscillator for generating a series of clock pulses;

(g) means for effecting a first conversion including a counter for said clock pulses connected to receive said first start and stop signals from said cross-over detectors to provide a first numerical count of N1 pulses, throwing of said first reversing switch to a second position resulting in said analog signal being subtracted from said reference voltage to provide two second output voltage levels from said differential operational amplifier means and result in second start and stop signals from said cross-over detectors when a second ramp voltage from said ramp voltage generator of the same slope as said first ramp voltage crosses over said two second output voltage levels, said second start and stop signals starting and stopping said counter to provide a second numerical count of N2 pulses; and, (h) means for dividing N1−N2 by N1+N2 to provide said numerical count, said differential operational amplifier means including an operational amplifier haveing a single ended input and ground terminals for receiving said analog signal and reference voltage signal, one of said first two output voltage levels constituting ground voltage level and the other the output from said operational amplifier when said analog signal is added to said reference voltage, and one of said second two output voltage levels constituting ground voltage level and the other the output level from said operational amplifier when said analog signal is subtracted from said reference voltage.

* * * * *